United States Patent
Nishikawa

(10) Patent No.: US 6,727,541 B2
(45) Date of Patent: Apr. 27, 2004

(54) SEMICONDUCTOR MEMORY DEVICE HAVING A TRENCH CAPACITOR

(75) Inventor: Kenichi Nishikawa, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/270,520

(22) Filed: Oct. 16, 2002

(65) Prior Publication Data

US 2003/0086308 A1 May 8, 2003

(30) Foreign Application Priority Data

Nov. 5, 2001 (JP) ..................... 2001-339277

(51) Int. Cl.⁷ ........................... H01L 27/108
(52) U.S. Cl. ................ 257/301; 257/68; 257/71; 257/296; 257/298; 257/905; 257/906; 438/242; 438/243; 438/386
(58) Field of Search .............. 257/68, 71, 295–313, 257/905–908; 438/242, 243, 386

(56) References Cited

U.S. PATENT DOCUMENTS

| | | | | |
|---|---|---|---|---|
| 5,177,576 A | * | 1/1993 | Kimura et al. ................. | 257/71 |
| 5,216,266 A | * | 6/1993 | Ozaki ........................ | 257/302 |
| 5,365,097 A | * | 11/1994 | Kenney ....................... | 257/302 |
| 5,519,236 A | * | 5/1996 | Ozaki ........................ | 257/302 |
| 5,529,944 A | * | 6/1996 | Rajeevakumar ............ | 438/242 |
| 5,731,609 A | * | 3/1998 | Hamamoto et al. ........ | 257/302 |
| 5,831,301 A | * | 11/1998 | Horak et al. ................ | 257/302 |
| 5,920,777 A | * | 7/1999 | Choi et al. .................. | 438/257 |
| 6,225,158 B1 | * | 5/2001 | Furukawa et al. .......... | 438/243 |
| 6,236,079 B1 | * | 5/2001 | Nitayama et al. ........... | 257/306 |

FOREIGN PATENT DOCUMENTS

| JP | 5-175424 | 7/1993 |
|---|---|---|
| JP | 7-130871 | 5/1995 |

* cited by examiner

Primary Examiner—David Nelms
Assistant Examiner—Andy Huynh
(74) Attorney, Agent, or Firm—Oblon, Spivak, McClelland, Maier & Neustadt, P.C.

(57) ABSTRACT

A semiconductor memory device having a trench capacitor, comprising: a semiconductor substrate of a fist conductivity type, having a trench which is formed from an upper surface of the semiconductor substrate to a predetermined depth; a capacitor formed in a lower portion of the trench and the semiconductor substrate of the fist conductivity type which is adjacent to the lower portion of the trench; a first conductive layer formed in the first trench and right above the first capacitor to which the first conductive layer is electrically connected; a first insulation film formed in the trench and right above the first conductive layer; a first diffusion layer formed in the semiconductor substrate of the fist conductivity type which is adjacent to the first conductive layer and the first insulation film, the first diffusion layer served as a source/drain electrode; a gate insulation film formed on a predetermined portion of the trench, the predetermined portion being located above the first insulation film; a second diffusion film formed in an upper portion of the semiconductor substrate of the fist conductivity type, the second diffusion layer being adjacent to the gate insulation film and served as a source/drain electrode; a second conductive layer having a first portion formed on the gate insulation film in the trench and a second portion formed right above the fist portion and extended up to a higher position than an upper surface of the semiconductor substrate of the fist conductivity type, the first and the second portions served as a gate electrode and a ward line respectively; and a second insulation film covered with an upper and side surface of the second portion of the gate electrode.

12 Claims, 20 Drawing Sheets

SEMICONDUCTOR MEMORY DEVICE HAVING A TRENCH CAPACITOR

CROSS-REFERENCE TO RELATED APPLICATION

This application is based upon and claims the benefit of priority from the prior Japanese Patent Application No. 2001-339277, filed Nov. 5, 2001, the entire contents of which are incorporated herein by reference.

BACKGROUND OF THE INVENTION

1. Field of the Invention

This present invention relates to a semiconductor memory device and a manufacturing method thereof, for example, a semiconductor memory device and its manufacturing method enhancing integrality of memory elements including a DRAM (Dynamic Random Access Memory).

2. Description of the Related Art

Conventionally, a transistor and a capacitor comprising a semiconductor memory device are formed as follows.

A top view of a manufacturing step of the semiconductor memory device is shown in FIG. 15(a). A cross sectional view corresponding to a broken line in FIG. 15 (a) is shown in FIG. 15(b). As shown in FIGS. 15(a) and 15(b), an oxide layer 102 is deposited on a P-type semiconductor substrate 101 and then a resist layer 103 is formed on the oxide layer 102. By using a lithography technique which is known, the resist layer 103 is patterned and then by using a RIE method (Reactive Ion Etching method), the oxide layer 102 is patterned, and a trench pattern is formed in the oxide layer 102.

As shown in FIG. 16, by using an anisotropic etching method, a trench is formed in the P-type semiconductor substrate 101 and then an As doped oxide layer 104 is formed on the resultant. After that, by using a etch back method, the As doped oxide layer 104 is removed up to a position 1 μm in depth from an upper surface of the surface of the P-type semiconductor substrate 101. By thermally diffusing arsenic (As) in the As doped oxide layer 104 to the P-type semiconductor substrate 101, a capacitor electrode diffusion layer 105 which is served as a plate electrode of DRAM is formed.

By using a treatment in fluoric atmosphere, the As doped oxide layer 104 is removed selectively and then, as shown in FIG. 17, an oxide layer 106 which is served as a capacitor insulation layer is formed on a side wall of the trench. An As doped poly crystalline 107 is deposited on the oxide layer 106 in the trench and then, by using a etch back method, the As doped poly crystalline 107 is removed up to a position 1 μm in depth from an upper surface of the surface of the P-type semiconductor substrate 101. Furthermore, an oxide layer 108 is formed on a surface of the oxide layer 106 and on the As doped poly crystalline silicon layer 107 in the trench. After that, by using a etch back method, the oxide layer 106 and 108 are removed up to a position 300 nm in depth from an upper surface of the surface of the P-type semiconductor substrate 101. And then, An As doped poly crystalline silicon layer 109 is deposited on the oxide layer 108 and a surface of the trench and then, by using a etch back method, the As doped poly crystalline silicon layer 109 is removed up to 50 nm in depth from an upper surface of the P-type semiconductor substrate 101. By thermally diffusing method, arsenic (As) in the As doped poly crystalline silicon layer 109 are diffused to the P-type semiconductor substrate 101, thereby forming a N type diffusion layer 110 which is served as a source or a drain region of a memory cell transistor. As mentioned above, the memory cell with a trench capacitor is formed.

A top view of the manufacturing step of the semiconductor memory cell is shown in FIG. 18(a) and a cross sectional view corresponding to a broken line in FIG. 18(a) is shown in FIG. 18(b). As shown in FIG. 18 (a) and (b), a resist layer 111 is formed on a resultant and then patterned. After that, by using a RIE method, portions of the oxide layer 102, the trench and the P-type semiconductor substrate 101 are removed and furthermore, the resist layer 111 is removed by ashing method.

As shown in FIG. 19, after an oxide layer 112 is deposited on the P-type semiconductor substrate 101 and the As doped poly crystalline silicon layer 109. And then, by using CMP method (Chemical Mechanical Polishing method), the oxide layer 112 is polished up to a surface of the P-type semiconductor substrate 101, thereby forming a element isolation insulation layer comprising the oxide layer 112.

A top view of the manufacturing step of the semiconductor memory cell is shown in FIG. 20(a) and a cross sectional view corresponding to a broken line in FIG. 20(a) is shown in FIG. 20(b). As shown in FIGS. 20(a) and (b), a oxide layer 113 which is served as a gate insulating film is formed on an upper surface of the P-type semiconductor substrate 101. An As doped poly crystalline silicon layer 114, a WSi layer 115 and a SiN layer 116 are formed in order, and then a resist layer 117 is formed on the SiN layer 116. The resist layer 117 is patterned to a word line pattern. After that, by using the patterned resist layer 117 as a mask and using a RIE method, the SiN layer 116, the WSi layer 115 and the As doped poly crystalline silicon layer 114 are etched in order, thereby forming a word line comprising the As doped poly crystalline silicon layer 114 and the WSi layer 115 which are used as a gate electrode.

The patterned resist layer 117 which is used as a word line pattern, is removed by an ashing method. A top view of a situation where the patterned resist layer 117 was removed is shown in FIG. 21(a) and a cross sectional view corresponding to a broken line in FIG. 21(a) is shown in FIG. 21(b). As shown in FIGS. 21(a) and (b), a SiN layer 118 is deposited on the resultant. And then, by using a RIE method, a portion of the SiN layer 118 is removed, thereby remaining a side wall insulation film which is consistent of the SiN layer 118 on side surfaces of the As doped poly crystalline silicon layer 114, the WSi layer 115 and the SiN layer 116. After that, Ions of Arsenic (As) are implanted to an exposed surface of the P-type semiconductor substrate 101, thereby forming N type diffusion layers 119 which are used as a source or a drain electrode. And then, a BPSG layer 120 is deposited on the resultant and then a reflow step is performed, thereby flattening an upper surface of the BPSG layer 120. A resist layer 121 is formed on the BPSG layer 120, and then the resist layer 121 is patterned to a contact pattern by using a lithography method. After that, by using the patterned resist layer 120 as a mask and using a RIE method, the BPSG layer 120 and the oxide layer 113 which are exposed are removed, thereby forming a contact hole on the N type diffusion layer 119 served as a source or a drain region.

The patterned resist layer 121 which was used as mask, is removed by an ashing method. A top view of a situation where the patterned resist layer 121 was removed is shown in FIG. 22(a) and a cross sectional view corresponding to a broken line in FIG. 22(a) is shown in FIG. 22(b). As shown in FIGS. 22(a) and (b), an As doped poly crystalline silicon layer 122 is deposited on the resultant. And then, by using an etch back method, a portion of the As doped poly crystalline silicon layer 122 is removed up to a position 300 nm in depth from an upper surface of the BPSG layer 120, thereby remaining a portion of the As doped poly crystalline silicon layer 122 in the contact hole. And then, a resist layer 123 is formed on the resultant and patterned to a bit line pattern. After that, by using a RIE method, a portion of the BPSG layer 120 is removed up to a position 300 nm in depth from an upper surface of the BPSG layer 120, thereby forming grooves which are served as a bit line pattern.

The patterned resist layer 123 which is used as a bit line pattern, is removed by an ashing method. A top view of a situation where the patterned resist layer 123 was removed is shown in FIG. 23(a) and a cross sectional view corresponding to a broken line in FIG. 23(a) is shown in FIG. 23(b). As shown in FIGS. 23(a) and (b), by using a damascene technique, a Ti layer 124 and a W layer 125 are formed in order on the resultant, followed by remaining the Ti layer 124 and the W layer 125, by using a CPM method, in the grooves which are serves as the bit line pattern. Thereby, DRAM cells are formed. Each of the DRAM cells has a trench capacitor which stores a data and a gate electrode which is served as word line. Each of the DRAM cells is connected a bit line.

In the DRAM cell formed as mentioned above, a deviation between a trench capacitor and a word line may be happened because the trench capacitor and the word line are formed, by using a different pattern, respectively. Therefore, at a design of the DRAM, a designer has to consider the deviation between the trench capacitor and the word line, and margin will be needed.

By decreasing the size of the DRAM cell, a channel length of the DRAM cell is shorter, because a gate insulating film of the DRAM cell is formed on a semiconductor substrate. As a result, a integrality of the DRAM cell is restricted because there is a problem of a short channel effect by which it is difficult to control a threshold voltage of the DRAM cell.

Furthermore, due to the deviation between the trench capacitor and the word line, the diffusion layer 110 of the trench capacitor may slip into under the source or the drain region of the transistor and a length of the source or the drain region of the transistor may be made to change, thereby changing the resistive value thereof. When more deviation happens and the diffusion layer 110 slips into under a channel region of the transistor, there are problems in that a short channel effect happens and, an unbalance of electrical characteristics between DRAM cells happens due to asymmetrical formation about a center of the bit line contact.

As mentioned above, conventionally, there are problems in that the integrality of the DRAM cell is disturbed, and not only an electrical change and degradation of the DRAM cells but also the unbalance between the DRAM cells happen.

SUMMARY OF INVENTION

A first aspect of the present invention is providing a semiconductor memory device having a trench capacitor, comprising: a semiconductor substrate of a fist conductivity type, having a trench which is formed from an upper surface of the semiconductor substrate to a predetermined depth; a capacitor formed in a lower portion of the trench and the semiconductor substrate of the fist conductivity type which is adjacent to the lower portion of the trench; a first conductive layer formed in the first trench and right above the first capacitor to which the first conductive layer is electrically connected; a first insulation film formed in the trench and right above the first conductive layer; a first diffusion layer formed in the semiconductor substrate of the fist conductivity type which is adjacent to the first conductive layer and the first insulation film, the first diffusion layer served as a source/drain electrode; a gate insulation film formed on a predetermined portion of the trench, the predetermined portion being located above the first insulation film; a second diffusion film formed in an upper portion of the semiconductor substrate of the fist conductivity type, the second diffusion layer being adjacent to the gate insulation film and served as a source/drain electrode; a second conductive layer having a first portion formed on the gate insulation film in the trench and a second portion formed right above the fist portion and extended up to a higher position than an upper surface of the semiconductor substrate of the fist conductivity type, the first and the second portions served as a gate electrode and a ward line respectively; and a second insulation film covered with an upper and side surface of the second portion of the gate electrode.

A second aspect of the present invention is providing a semiconductor memory device having a trench capacitor, comprising: a semiconductor substrate of a fist conductivity type, having a fist and second trenches which are formed from an upper surface of the semiconductor substrate to a predetermined depth respectively; a first capacitor formed in a lower portion of the first trench and the semiconductor substrate of the fist conductivity type which is adjacent to the lower portion of the first trench; a second capacitor formed in a lower portion of the second trench and the semiconductor substrate of the fist conductivity type which is adjacent to the lower portion of the second trench; a first conductive layer formed in the first trench and right above the first capacitor to which the first conductive layer is electrically connected; a second conductive layer formed in the second trench and right above the second capacitor to which the second conductive layer is electrically connected; first and second insulation films formed in the first and second trenches and right above the first and second conductive layer respectively; a first diffusion layer formed in the semiconductor substrate of the fist conductivity type which is adjacent to the first conductive layer and the first insulation film, the first diffusion layer served as a source/drain electrode; a second diffusion layer formed in the semiconductor substrate of the fist conductivity type which is adjacent to the second conductive layer and the second insulation film, the second diffusion layer served as a source/drain electrode; a first gate insulation film formed on a predetermined portion of the first trench, the predetermined portion being located above the first insulation film; a second gate insulation film formed on a predetermined portion of the second trench, the predetermined portion being located above the second insulation film; a third diffusion layer formed in an upper portion of the semiconductor substrate of the fist conductivity type, the third diffusion layer being adjacent to the first and second gate insulation films, and served as a source/drain electrode; a third conductive layer having a first portion formed on the fist gate insulation film in the first trench and a second portion formed right above the fist portion and extended up to a higher position than an upper surface of the semiconductor substrate of the fist conductivity type, the first and the second portions served as a gate electrode and a ward line respectively; a fourth gate electrode having a third portion formed on the second gate insulation film in the second trench and a fourth portion formed right above the third and extended up to a higher position than an upper surface of the semiconductor substrate of the fist conductivity type, the third and the fourth portions served as a gate electrode and a ward line respectively; a fifth insulation film covered with an upper and side surface of the second portion of the third conductive layer; and a sixth insulation film covered with an upper and side surface of the fourth portion of the fourth gate electrode.

A third aspect of the present invention is providing a method for manufacturing a semiconductor memory device having a trench capacitor, comprising: forming a first insulation film on a semiconductor substrate of a fist conductivity type; forming a trench in the first insulation film and the semiconductor substrate of the fist conductivity type by removing a predetermined portion of the first insulation film and the semiconductor substrate of the fist conductivity type; forming a plate electrode in the semiconductor substrate of the fist conductivity type that is adjacent to a lower portion of the trench; forming a capacitor dielectric film on the lower portion of the trench; forming a storage electrode on the capacitor dielectric film; forming a first diffusion layer in the semiconductor substrate of the fist conductivity type in the trench, the first diffusion layer electrically connected to the storage electrode; forming a gate insulation film on a side surface of the trench, the gate insulation film being adjacent to the first diffusion layer; forming a first conductive layer having a first portion that is formed on the gate insulation film and a second portion formed right above the fist portion and extended up to a higher position than an upper surface of the semiconductor substrate of the fist conductivity type, the first and the second portions served as a gate electrode and a ward line respectively; forming a second insulation film that is covered with the second portion of the first conductive layer; exposing the upper surface of the semiconductor substrate of the fist conductivity type by removing a portion of the first insulation film in use of the second insulation film as a mask; and forming a second diffusion layer in an exposed portion of the semiconductor substrate of the fist conductivity type.

DETAILED DESCRIPTION OF THE INVENTION

Hereinafter, we will explain about an embodiment of the present invention with reference to FIGS. 1 to 14.

Figures 1A, 1B:
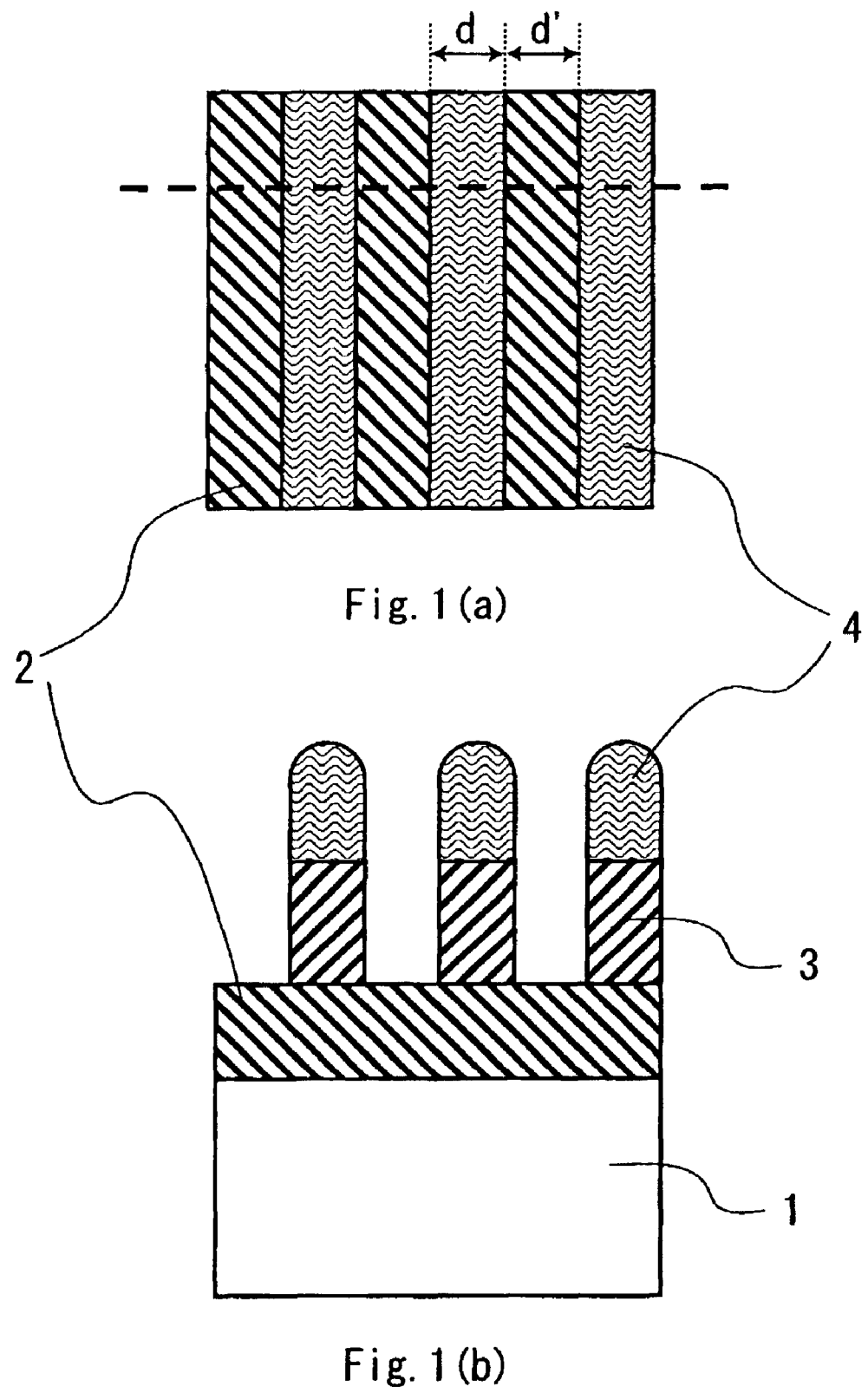
FIGS. 1(a) and (b) show a manufacturing step of a semiconductor memory device associated with an embodiment of the present invention.

A top view of a manufacturing step of an embodiment in the present invention is shown in FIG. 1(a) and a cross sectional view corresponding to a broken line in FIG. 1 (a) is shown in FIG. 1(b). As shown in FIGS. 1(a) and (b), an oxide layer 2 thickness of 200 nm is formed on a P-type semiconductor substrate 1 by using a thermal oxide method, and then a B (Boron) doped oxide layer 3 thickness of 400 nm is formed on the oxide layer 2 by using a CVD method. After that, a resist layer 4 thickness of 800 nm is formed on the B doped oxide layer 3, and then by using a known lithography technique, the resist layer 4 is patterned, thereby forming a mask for forming word lines. In this case, widths (d,d') of a first pattern and a second pattern are 200 nm, respectively. And then, the B doped oxide layer 3 is etched by using the patterned resist layer 4 as a mask and using a RIE method.

Figures 2A, 2B:
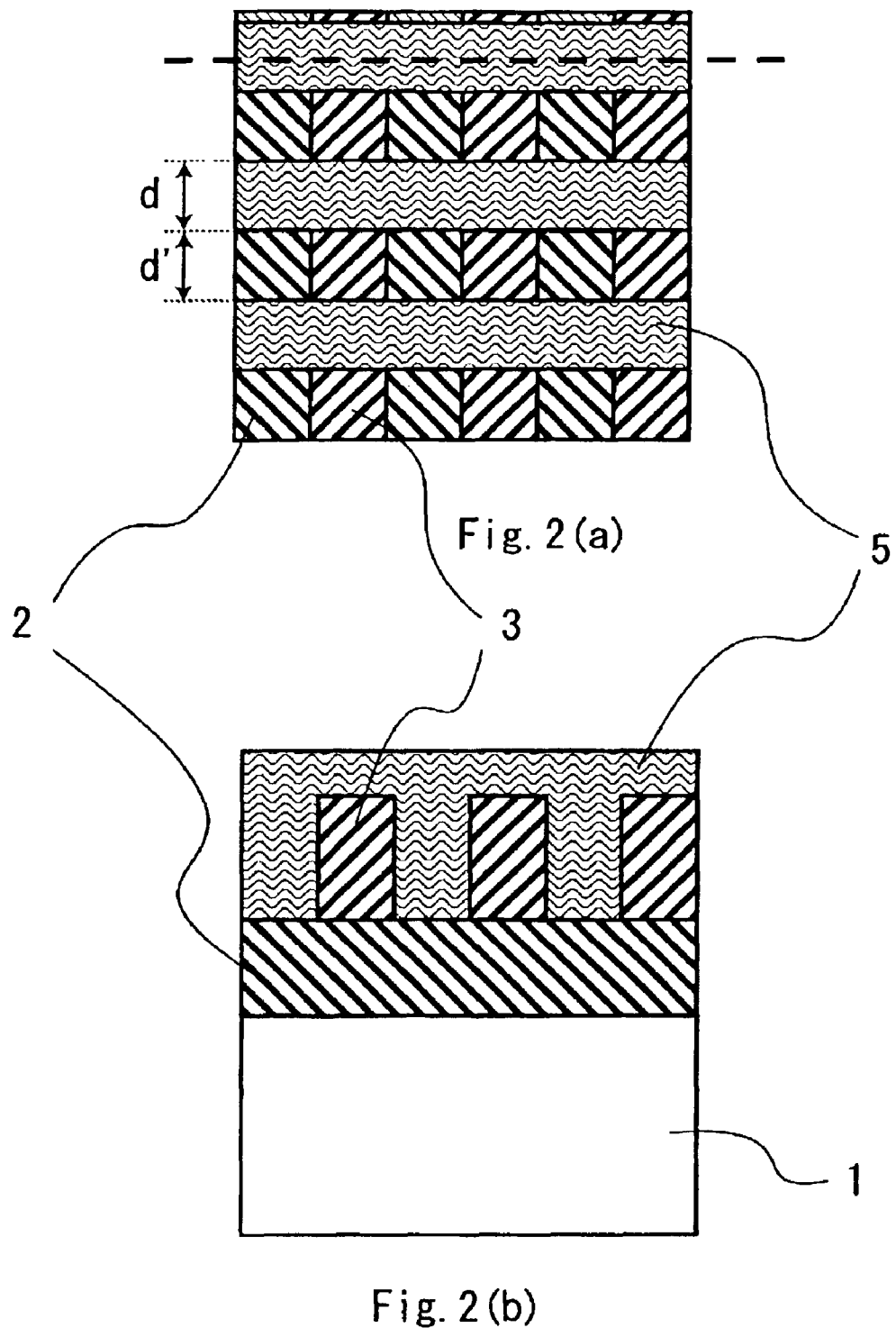
FIGS. 2(a) and (b) show a manufacturing step of a semiconductor memory device associated with an embodiment of the present invention.

A top view of a manufacturing step of an embodiment in the present invention is shown in FIG. 2(a) and a cross sectional view corresponding to a broken line in FIG. 2(a) is shown in FIG. 2(b). As shown in FIGS. 2(a) and (b), the resist layer 4 which was used as a mask of word lines, is removed by a ashing method, and then a resist layer 5 is formed on the resultant. The resist layer 5 is patterned so as to be vertical to the B doped oxide layer 3. In this case, widths (d,d') of a third pattern and a fourth pattern are 200 nm, respectively.

Figures 3A, 3B:
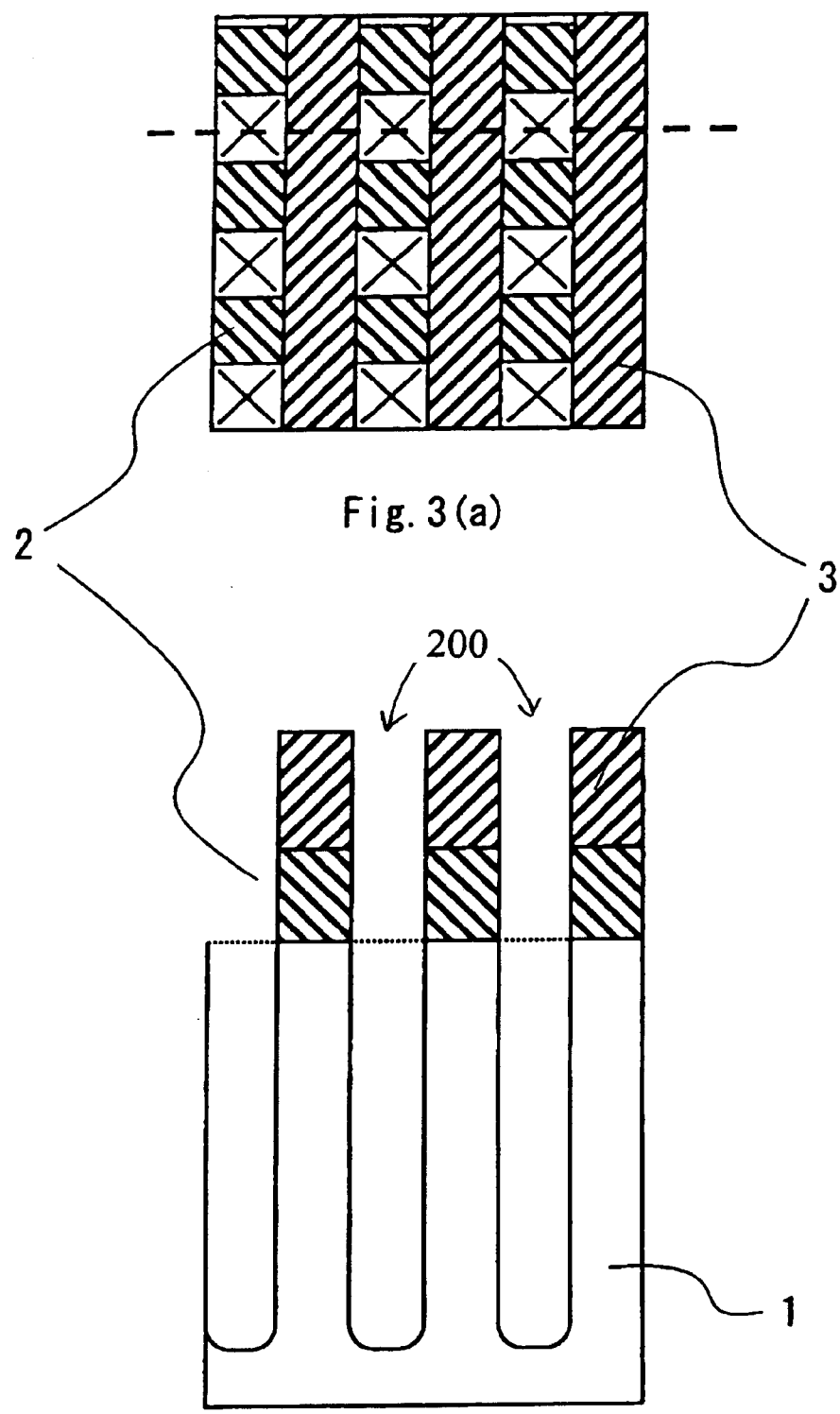
FIGS. 3(a) and (b) show a manufacturing step of a semiconductor memory device associated with an embodiment of the present invention.

A top view of a manufacturing step of an embodiment in the present invention is shown in FIG. 3(a) and a cross sectional view corresponding to a broken line in FIG. 3(a) is shown in FIG. 3(b). As shown in FIGS. 3(a) and (b), predetermined portions of the oxide layer 2 and the P-type semiconductor substrate 1 are removed by using a RIE method, thereby forming trenches 200, depth of 5 μm, in the P-type semiconductor substrate 1. In this case, the B doped oxide layer 3 which is patterned to a word line pattern and the resist layer 3 which is vertical thereto, are used as masks. And then, the resist layer 5 is removed by using an ashing method.

Figure 4:
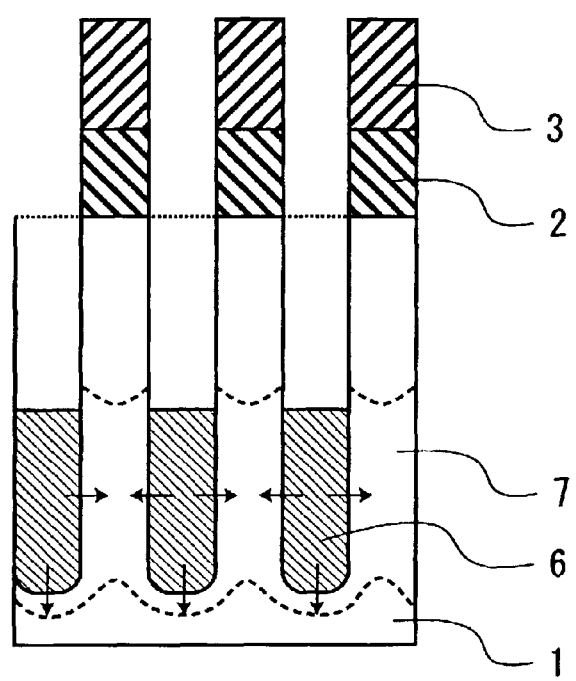
FIG. 4 shows a manufacturing step of a semiconductor memory device associated with an embodiment of the present invention.

As shown in FIG. 4, by using a CVD method, an As doped oxide film 6, thickness of 200 nm, is formed on entire surface of the resultant and is buried in the trenches 200. And then, the As doped oxide film 6 is removed up to a position of 2 μm from the P-type semiconductor substrate 1 by using a etch back method (a treatment in an atmosphere with fluoric acid). Below the position, a capacitor of a DRAM cell will be formed. And then, arsenic in the As doped oxide film 6 is made to diffuse thermally to the P-type semiconductor substrate 1 at the temperature of 900° C. or more. An N type diffusion layer 7 is used as a plate electrode of a DRAM cell.

Figure 5:
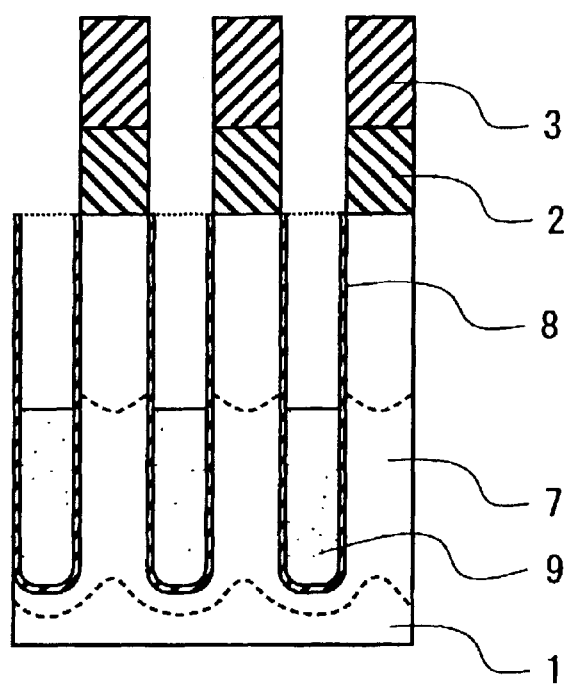
FIG. 5 shows a manufacturing step of a semiconductor memory device associated with an embodiment of the present invention.

As shown in FIG. 5, the As doped oxide film 6 in the trenches 200 is removed selectively by using a treatment in an atmosphere with fluoric acid, and then a oxide layer 8, thickness of 200 nm, which is used as a capacitor insulation film, is formed in the trenches 200 by using a thermal oxidation method. Furthermore, an As doped poly crystalline silicon layer 9 thickness of 200 nm is formed on the resultant by using a CVD method, and buries the trenches 200. And then, the As doped poly silicon layer 9 is selectively removed up to a position of 2 μm from the P-type semiconductor substrate 1 by using a RIE method, thereby forming a storage electrode of a DRAM cell.

Figure 6:
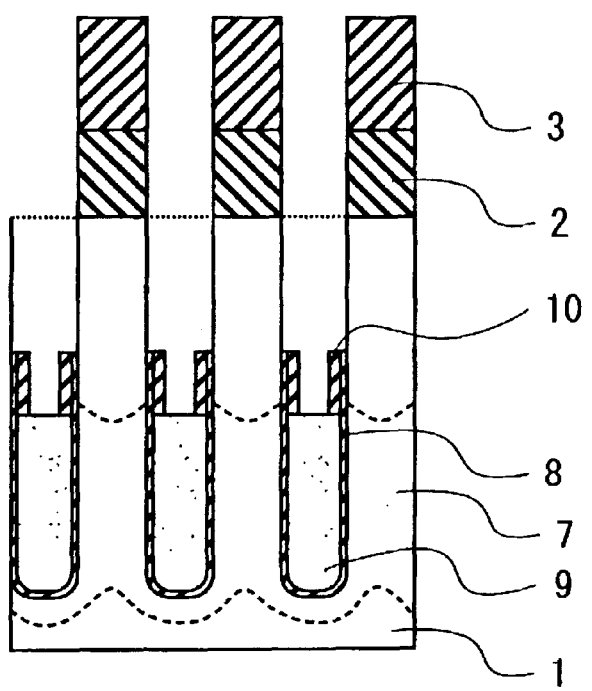
FIG. 6 shows a manufacturing step of a semiconductor memory device associated with an embodiment of the present invention.

Furthermore, as shown in FIG. 6, by using a CVD method an oxide layer 10, thickness of 30 nm, is formed on the resultant to prevent the trenches 200, diameter of 200 nm from being buried. And then, the oxide layer 8 which is formed previously and the oxide layer 10 are removed up to a position 1.3 μm from the P-type semiconductor substrate 1 by using a RIE method.

Figure 7:
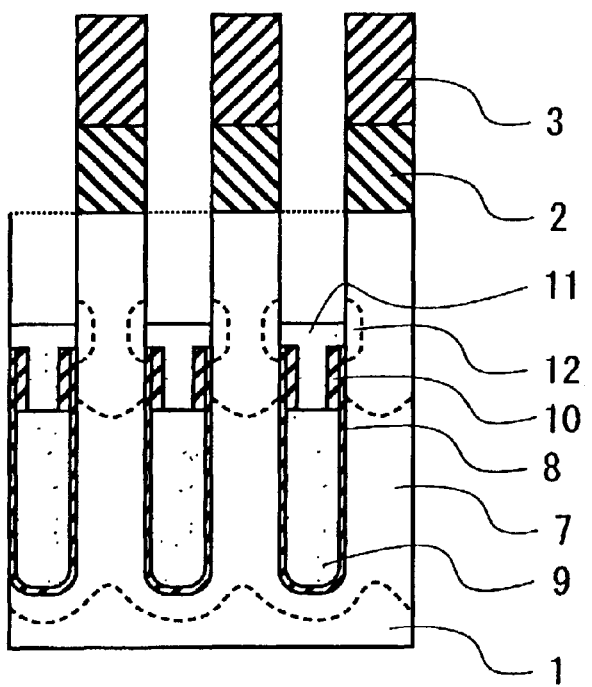
FIG. 7 shows a manufacturing step of a semiconductor memory device associated with an embodiment of the present invention.

As shown in FIG. 7, an As doped poly crystalline silicon layer 11 thickness of 200 nm is deposited on the resultant by using a CVD method, and then the As doped poly crystalline silicon layer 11 is removed up to a position 1.0 μm from the P-type semiconductor substrate 1 by using a RIE method. After that, arsenic in the As doped poly crystalline silicon layer 11 is made to diffuse to the P-type semiconductor substrate 1 by using a thermal diffusion method, thereby forming a N type diffusion layer 12 which is used as a drain region of a transistor.

Figure 8:
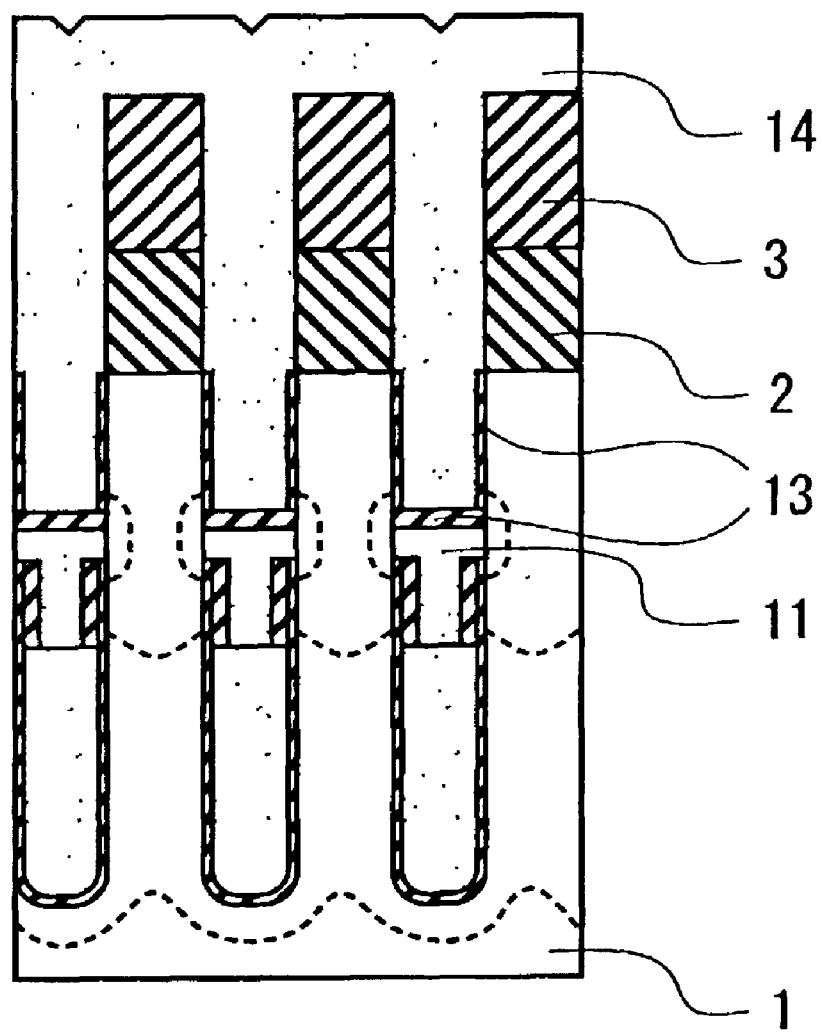
FIG. 8 shows a manufacturing step of a semiconductor memory device associated with an embodiment of the present invention.

As shown in FIG. 8, an oxide layer 13 thickness of 10 nm is formed on the As doped poly crystalline silicon layer 11 and a side surface of the trenches 200 by a thermal oxidation method. And then, an As doped poly crystalline silicon layer 14 is formed by using a CVD method.

Figures 9A, 9B:
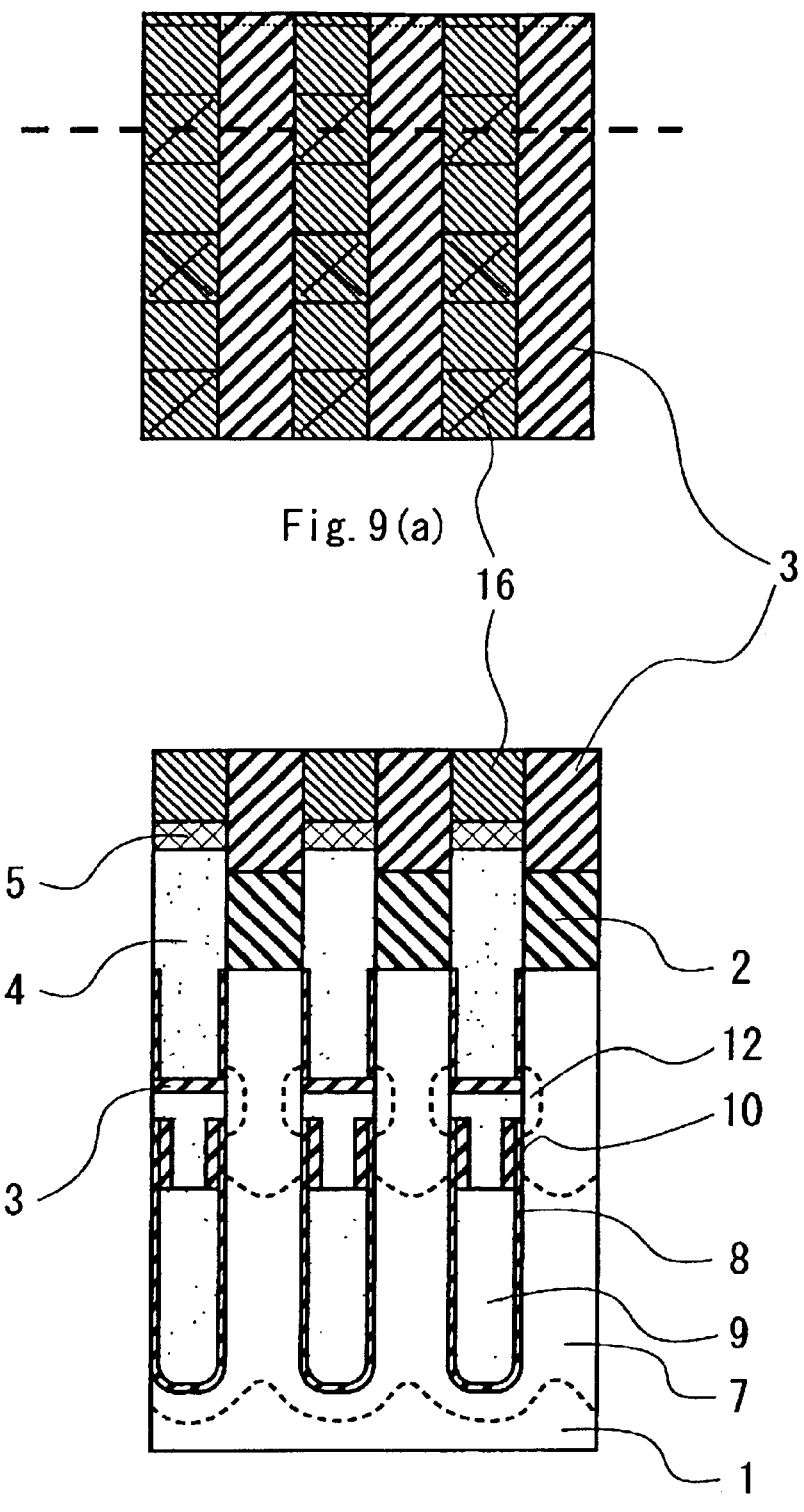
FIGS. 9(a) and (b) show a manufacturing step of a semiconductor memory device associated with an embodiment of the present invention.

A top view of a manufacturing step of an embodiment in the present invention is shown in FIG. 9(a) and a cross sectional view corresponding to a broken line in FIG. 9(a) is shown in FIG. 9(b). As shown in FIGS. 9(a) and (b), the As doped poly crystalline silicon layer 14 is removed up to height 50 nm above a surface of the oxide layer 2 by using a RIE method. After that, a WSi layer 15 thickness of 200 nm is deposited on the As doped poly crystalline silicon layer 11 by a CVD method, and then the WSi layer 15 is removed up to 50 nm in thickness by using a RIE method. Furthermore, a SiN layer 16 thickness of 200 nm is deposited on the WSi layer 15 by using a CVD method, and then the SiN layer 16 is removed and flattened up to a surface of the B doped oxide layer 3 by using a CMP method, thereby forming word lines each of which is comprised of the As doped poly crystalline silicon layer 14 and the WSi layer 15, and the SiN layer 16 which is covered with each of the word lines.

Figure 10:
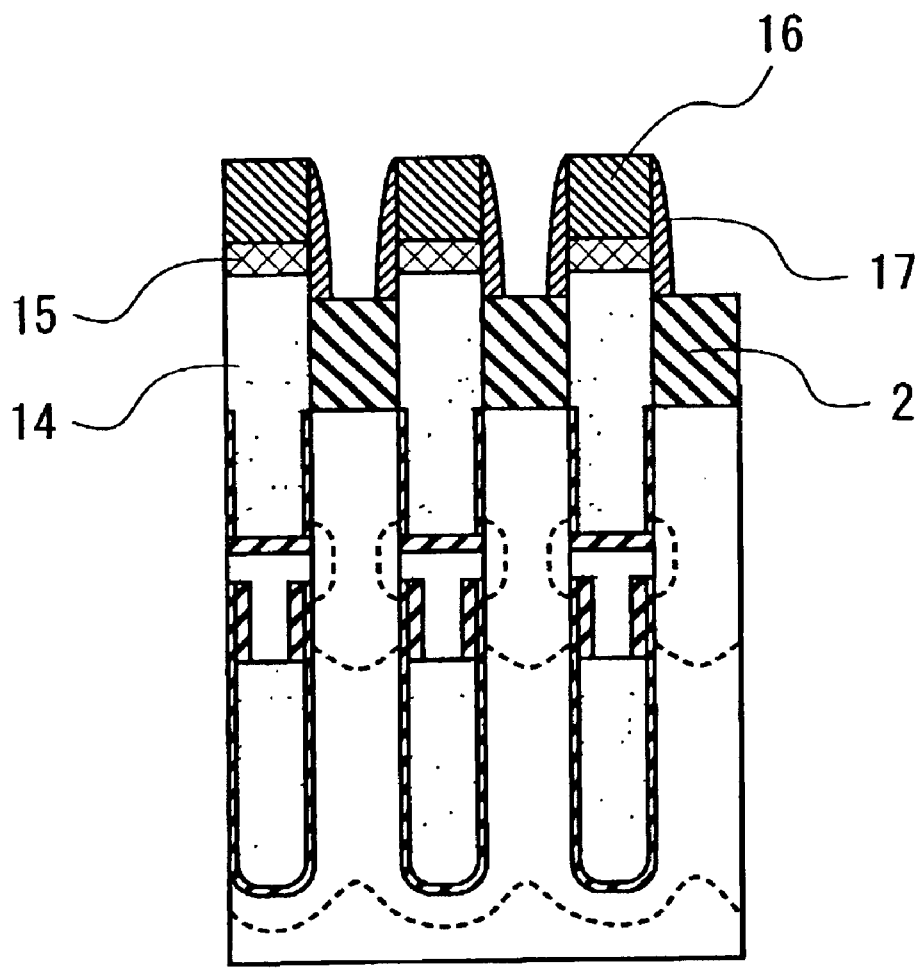
FIG. 10 shows a manufacturing step of a semiconductor memory device associated with an embodiment of the present invention.

The B doped oxide layer 3 is removed by using a treatment of fluoric acid. A cross sectional view of a situation where the B doped oxide layer 3 was removed is shown in FIG. 10. As shown in FIG. 10, a SiN layer 17 thickness of 30 nm is formed on an entire surface of the resultant by using a CVD method, and then predetermined portions of the SiN 17 are removed by using a RIE method, thereby forming a side wall insulation film on the side wall of the SiN layer 16, the WSi layer 15 and the As doped poly crystalline silicon layer 14.

Figures 11A, 11B:
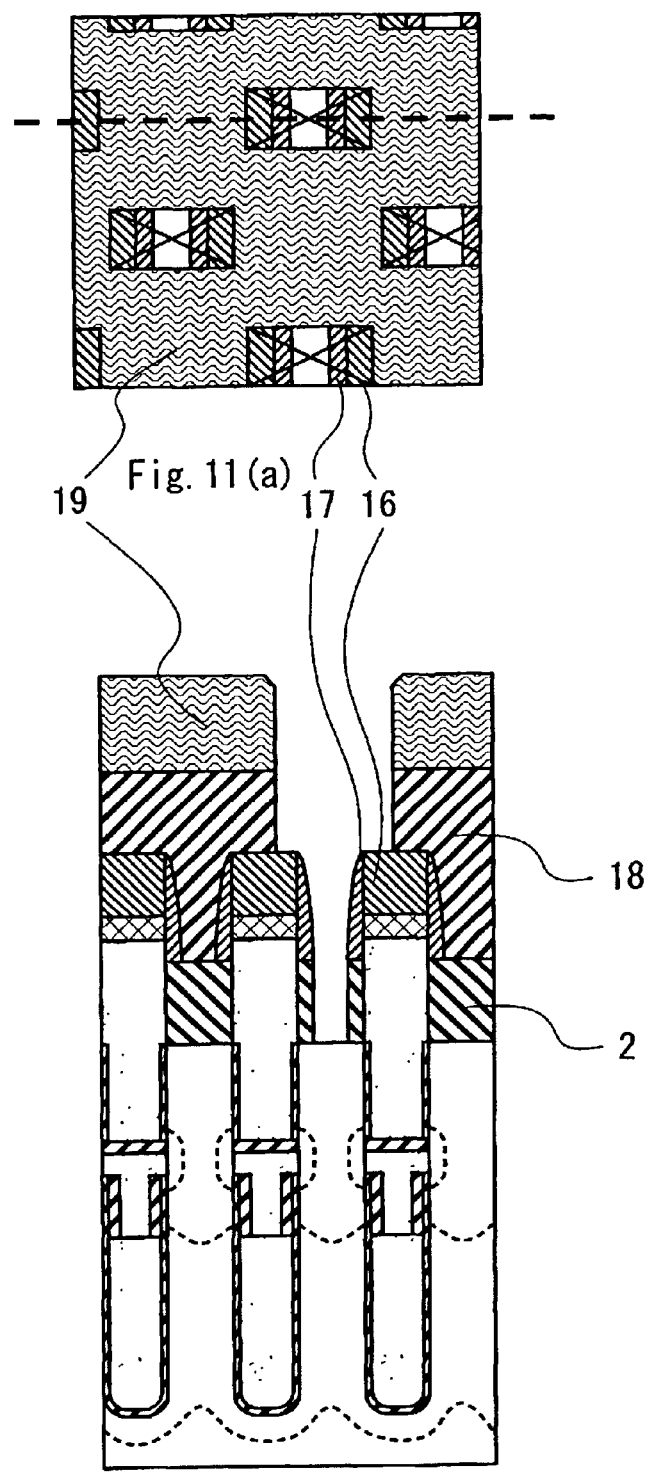
FIGS. 11(a) and (b) show a manufacturing step of a semiconductor memory device associated with an embodiment of the present invention.

A top view of a manufacturing step of an embodiment in the present invention is shown in FIG. 11(a) and a cross sectional view corresponding to a broken line in FIG. 11(a) is shown in FIG. 11(b). As shown in FIGS. 11(a) and (b), a BPSG layer 18 thickness of 400 nm is formed on the resultant by using a CVD method, and then the BPSG layer 18 is reflowed. After that, a resist layer 19 is formed on the BPSG layer 18, and then the resist layer 19 is patterned to a contact pattern by using a lithography method. And then, the BPSG layer 18 and the oxide layer 2 are removed by using the patterned resist layer 19 as a mask and using a RIE method, thereby forming contact holes.

Figure 12:
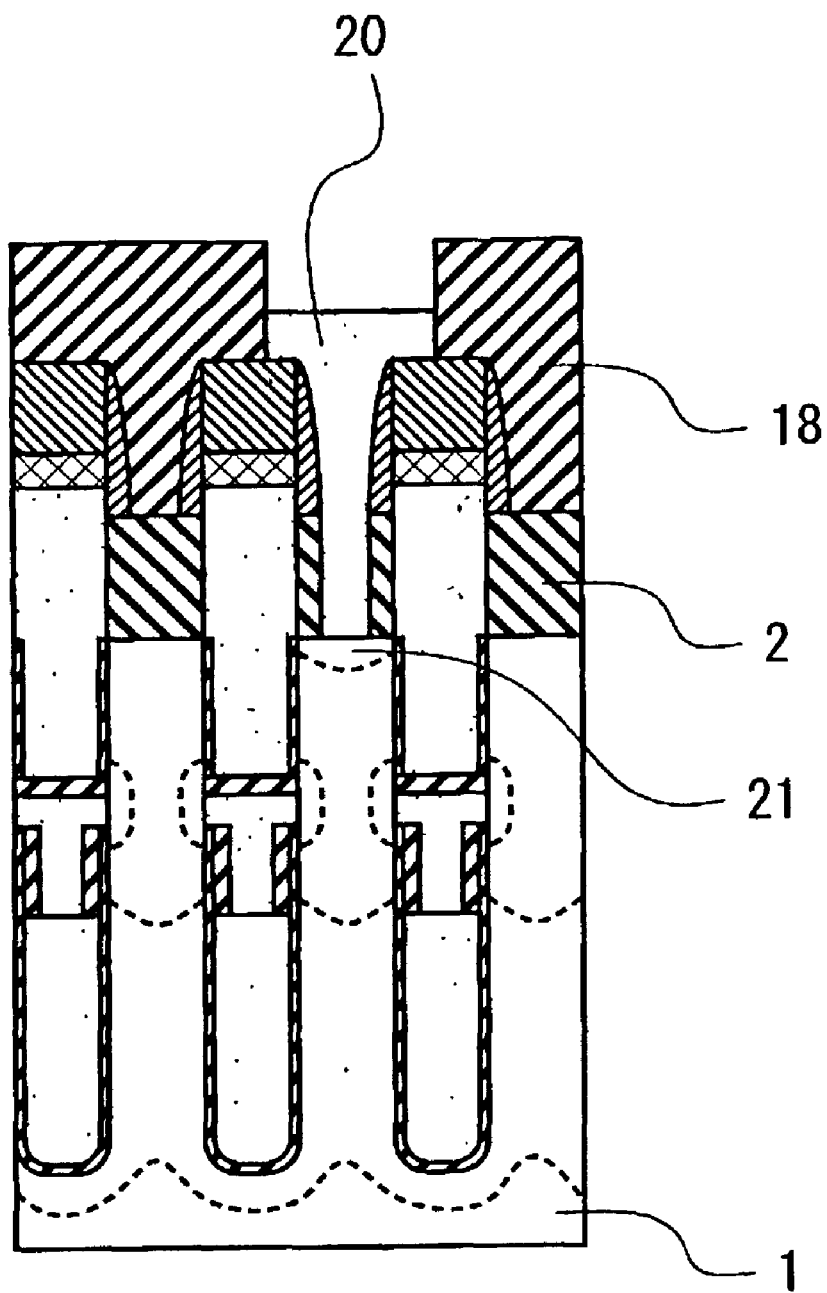
FIG. 12 shows a manufacturing step of a semiconductor memory device associated with an embodiment of the present invention.

The resist layer 19 which is patterned to the contact pattern is removed by an ashing method. As shown in FIG. 12, an As doped poly crystalline silicon layer 20 thickness of 300 nm is deposited on an entire surface of the resultant, and then the As doped poly crystalline silicon layer 20 is removed up to a position 300 nm from a surface of the BPSG layer 18 by using a RIE method. Arsenic in the As doped poly crystalline silicon layer 20 is made to diffuse into the P-type semiconductor substrate 1 by using a thermal diffusion method, thereby forming N type diffusion layers 21 which are used as a source region of a transistor.

Figures 13A, 13B:
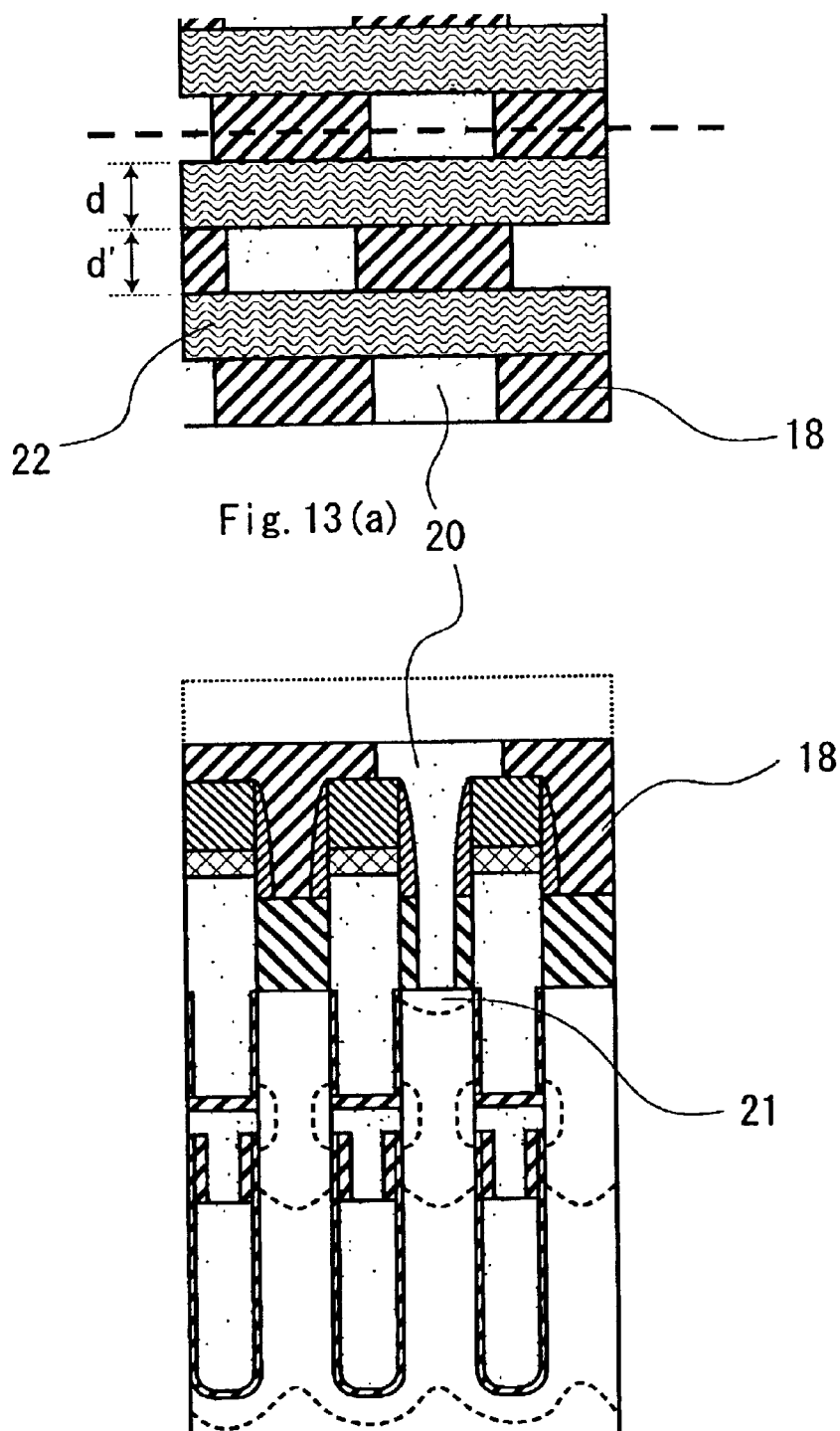
FIGS. 13(a) and (b) show a manufacturing step of a semiconductor memory device associated with an embodiment of the present invention.

Furthermore, a top view of a manufacturing step of an embodiment in the present invention is shown in FIG. 13(a) and a cross sectional view corresponding to a broken line in FIG. 13(a) is shown in FIG. 13(b). As shown in FIGS. 13(a) and (b), a resist layer 22 is formed on an entire surface of the resultant, and then the resist layer 22 is patterned to a bit line pattern which is vertical to the word lines by using a lithography method. In this case, widths of a fifth pattern and a sixth pattern (d,d') are 200 nm respectively. And then, predetermined portions of the BPSG layer 18 thickness of 300 nm are removed selectively by using a RIE method, thereby forming grooves which are used as a bit line pattern.

Figures 14A, 14B:
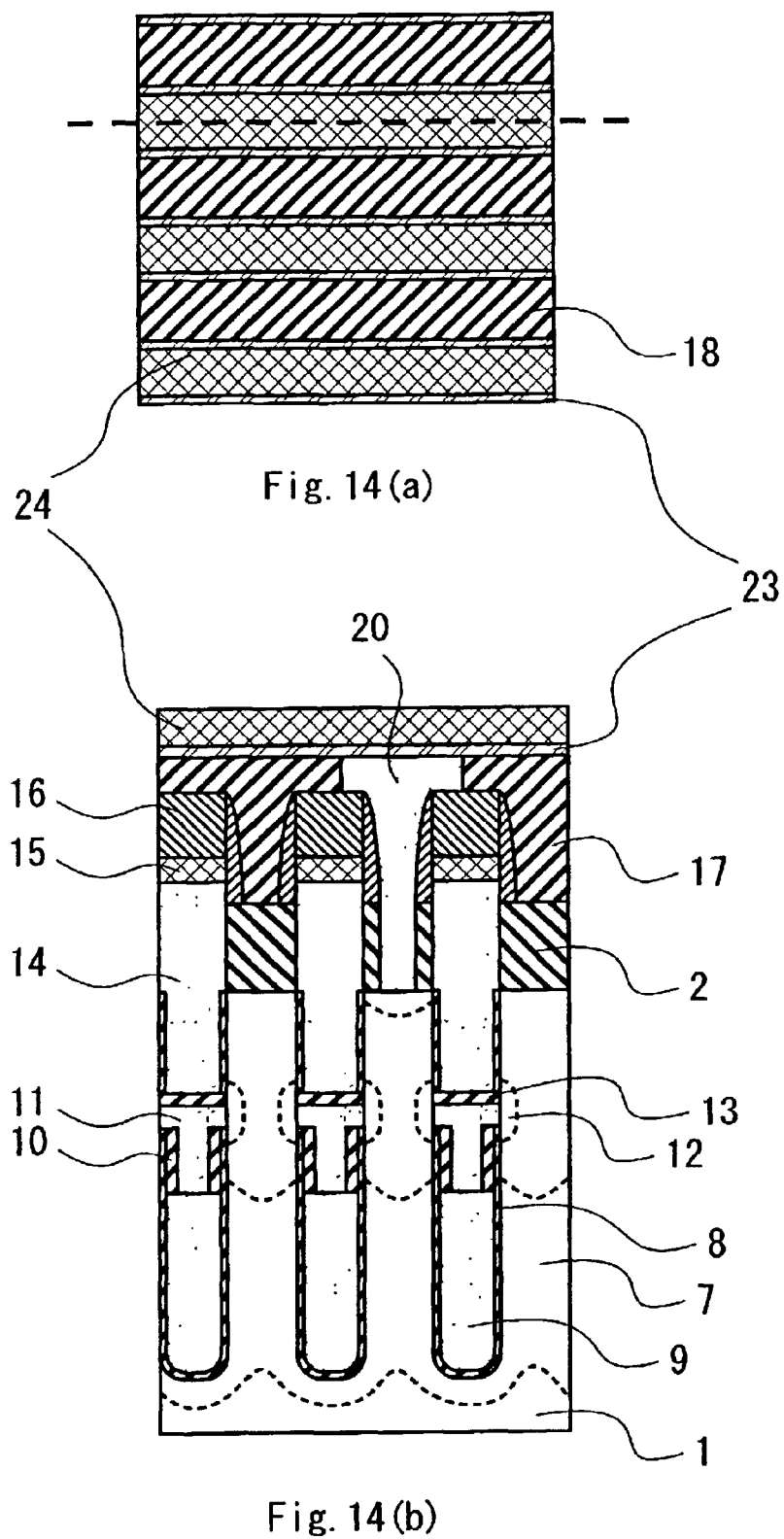
FIGS. 14(a) and (b) show a manufacturing step of a semiconductor memory device associated with an embodiment of the present invention.
Figure 15A:
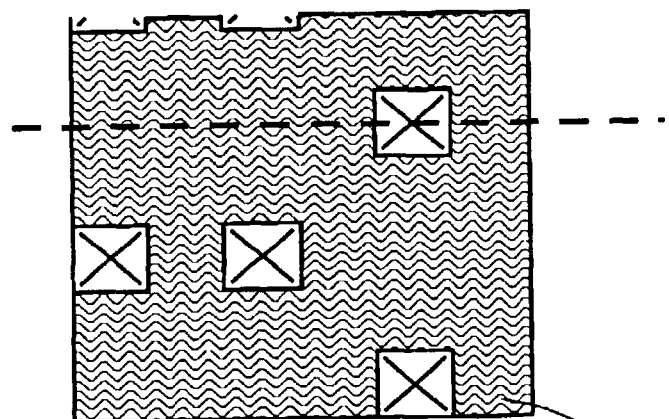
FIGS. 15(a) and (b) show a manufacturing step of a conventional semiconductor memory device.
Figure 15B:
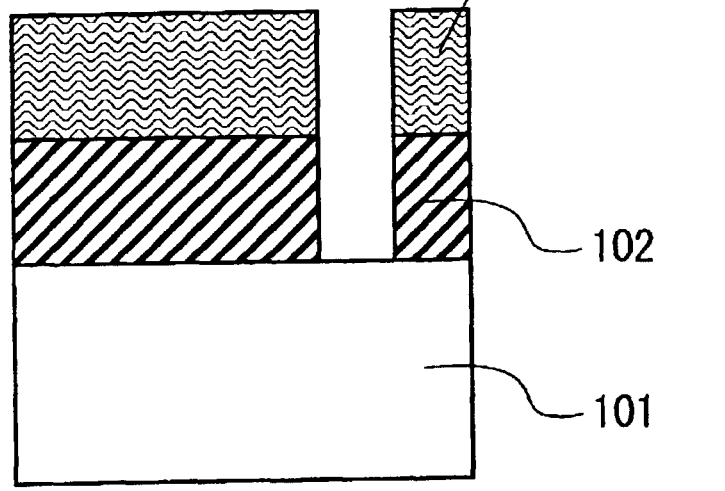
Figure 16:
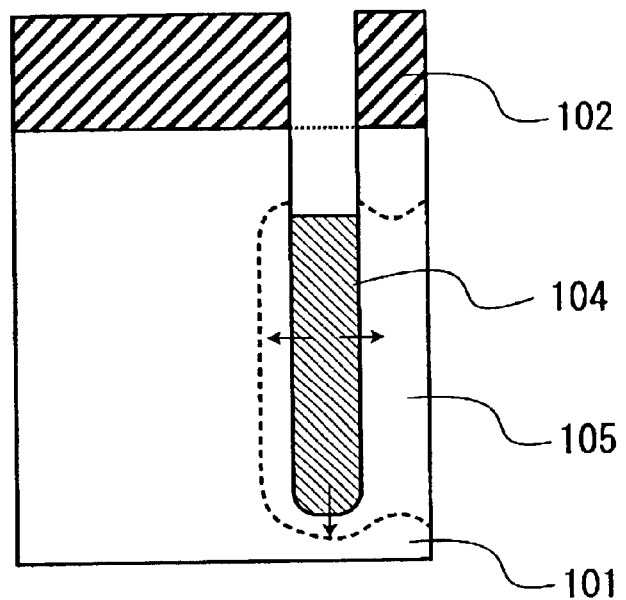
FIG. 16 shows a manufacturing step of a conventional semiconductor memory.
Figure 17:
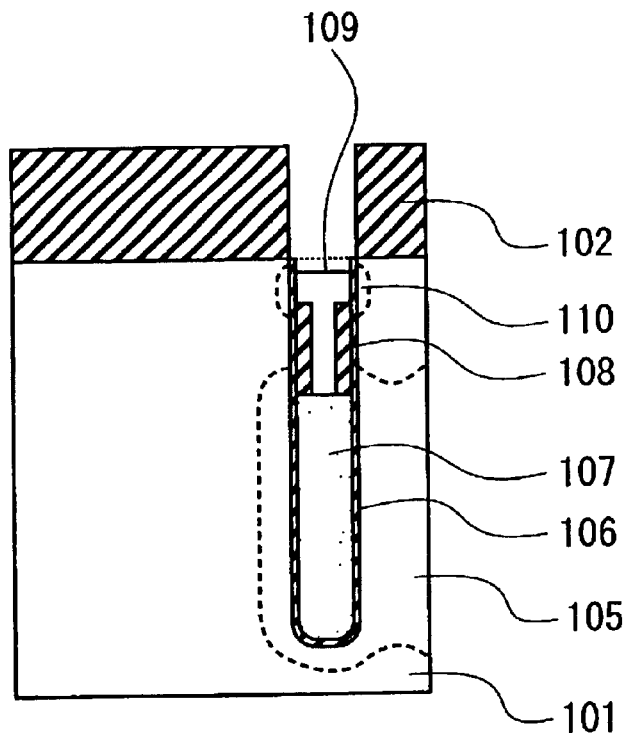
FIG. 17 shows a manufacturing step of a conventional semiconductor memory.
Figure 18A:
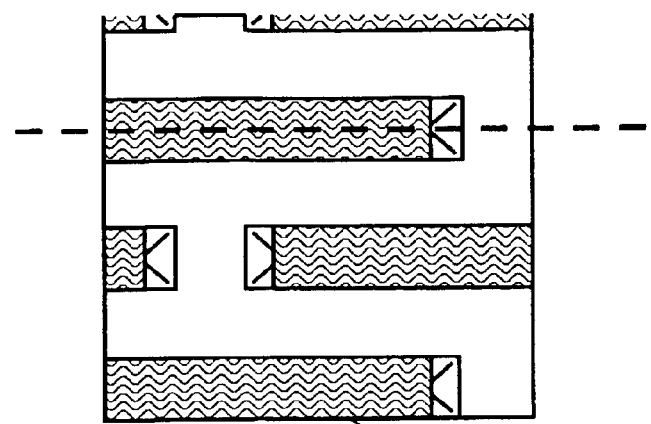
FIGS. 18(a) and (b) show a manufacturing step of a conventional semiconductor memory device.
Figure 18B:
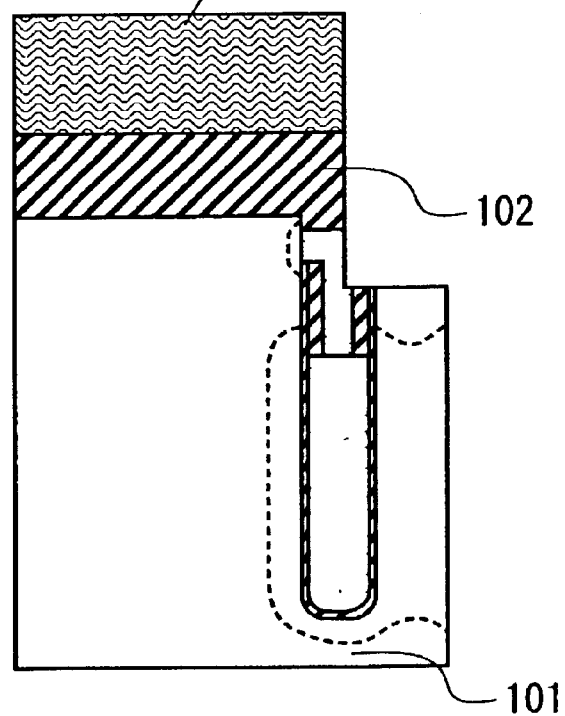
Figure 19:
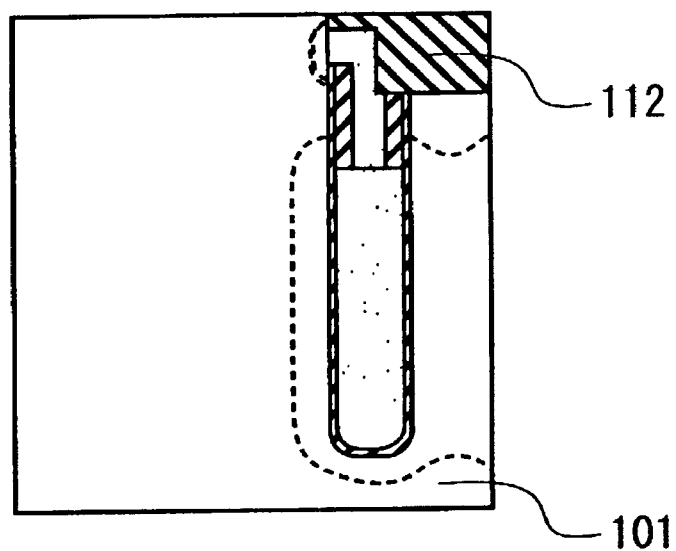
FIG. 19 shows a manufacturing step of a conventional semiconductor memory.
Figures 20A, 20B:
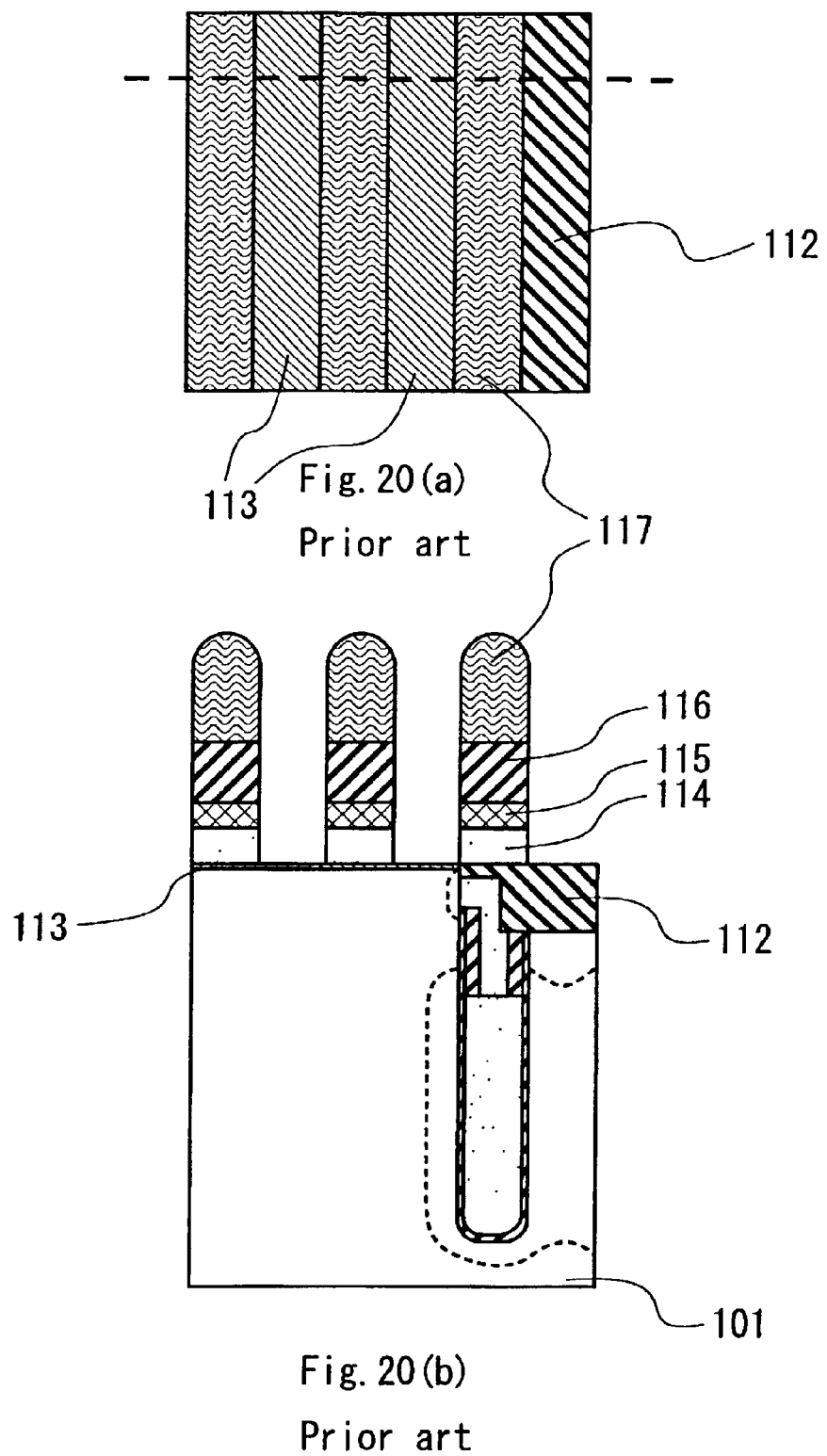
FIGS. 20(a) and (b) show a manufacturing step of a conventional semiconductor memory device.
Figures 21A, 21B:
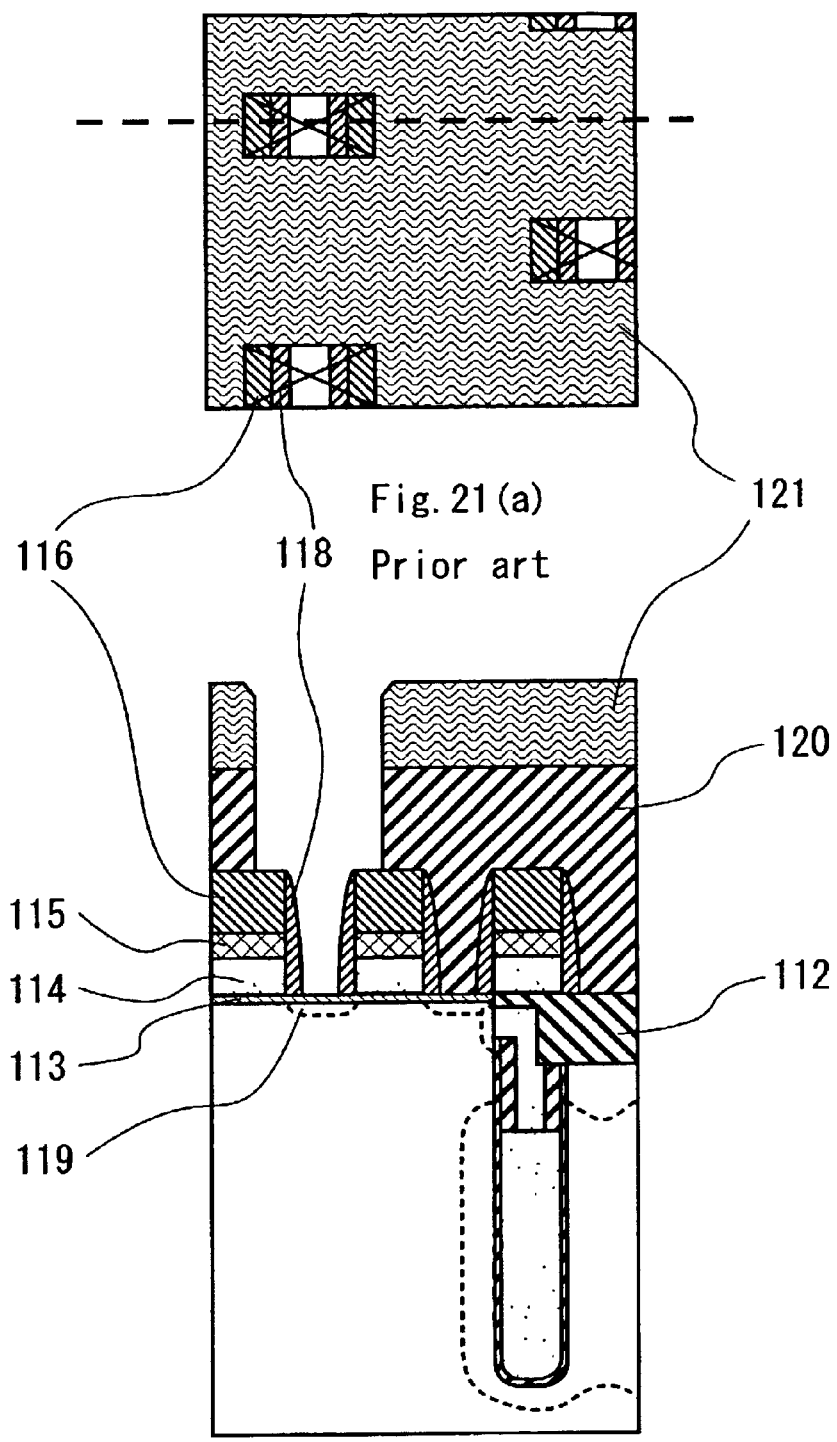
FIGS. 21(a) and (b) show a manufacturing step of a conventional semiconductor memory device.
Figures 22A, 22B:
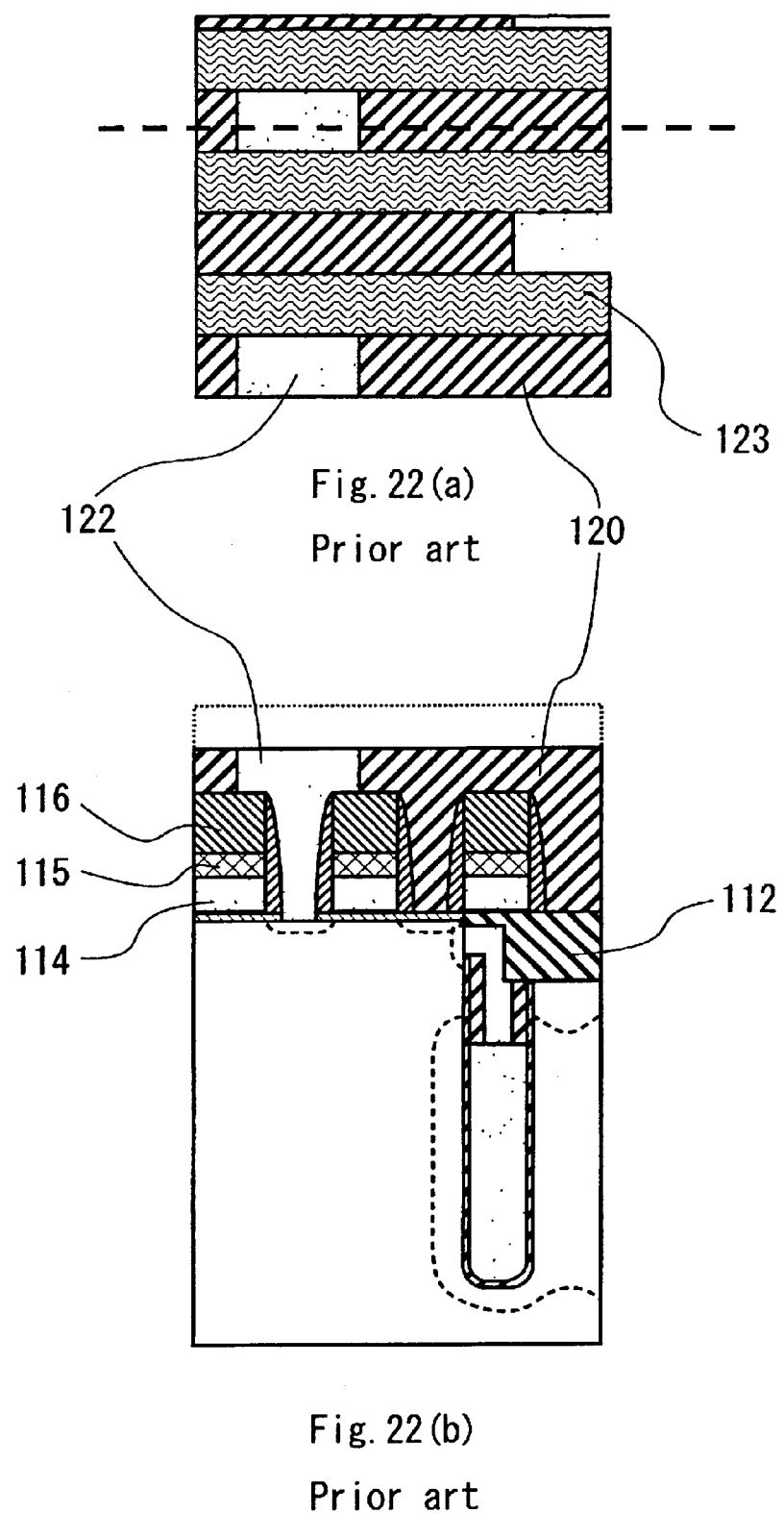
FIGS. 22(a) and (b) show a manufacturing step of a conventional semiconductor memory device.
Figures 23A, 23B:
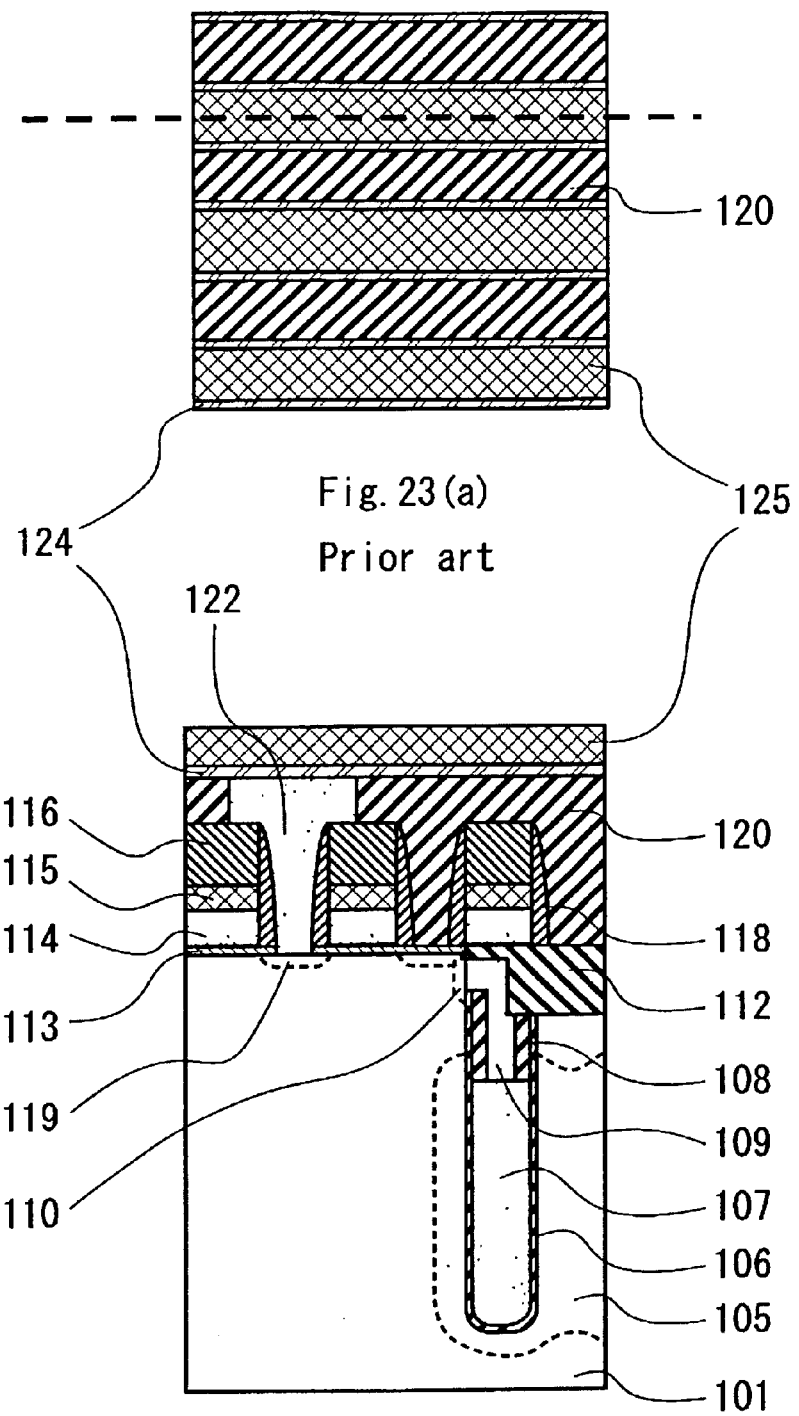
FIGS. 23(a) and (b) show a manufacturing step of a conventional semiconductor memory device.

The patterned resist layer 22 is removed by using an ashing method. A top view of a situation where the resist layer 22 was removed is shown in FIG. 14(a) and a cross sectional view corresponding to a broken line in FIG. 14(a) is shown in FIG. 14(b). As shown in FIGS. 14(a) and (b), a Ti layer 23 thickness of 300 nm is deposited on the resultant by using a sputter method, and then a W layer 24 thickness of 200 nm is deposited on the Ti layer 23 by using a CVD method. After that, the Ti layer 23 and the W layer 23 are flattened up to an upper surface of the BPSG layer 18 by using a CMP method, thereby forming bit lines which are comprising of the Ti layer 23 and the W layer 23 and formed in the grooves. Thereby, semiconductor memory devices are formed, and each of the semiconductor memory deices has a capacitor located in a lower portion of the trench 200 which is formed in the P-type semiconductor substrate 1 and a transistor located in an upper portion of the trench 200 which is formed in the P-type semiconductor substrate 1.

In the semiconductor memory device formed as mentioned above, the capacitor is comprised of a plate electrode (N type diffusion layer 7), a storage electrode (As doped poly crystalline silicon layer 9), and a capacitor insulation film (oxide layer 8). And the transistor is comprised of a drain/source region (N type diffusion layer 12), a drain/source region (N type diffusion layer 21), a gate electrode (As doped poly crystalline silicon layer 14) and a gate insulation film (oxide layer 13).

The N type diffusion layer 12 (drain/source region) of the transistor is electrically connected to the As doped poly crystalline silicon layer 9 (the storage electrode) via the As doped poly crystalline silicon layer 11 (contact), and electrically isolated from the N type diffusion layer 7 (plate electrode) by the oxide layer 8 (capacitor insulation film). And N type diffusion layer 21 (drain/source region) is electrically connected to the Ti layer 23 and the W layer 24 (bit line) via the As doped poly crystalline silicon layer 20 (contact). The word line is comprised of the As doped poly crystalline silicon layer 14 (gate electrode) and the WSi layer 15. The semiconductor memory devices are electrically isolated from each other by a presence of the oxide layer 2. The N type diffusion layers 7 (plate electrode) are electrically connected to each other so that each of the N type diffusion layers 7 is same voltage level.

In the semiconductor memory device as mentioned above, a position of the word line is determined by a position of the B doped oxide layer 3 which is used as a mask in the case of forming the trenches 200. Therefore, the word line and the trench 200 are formed with self-align, and a margin for deviation between them is not needed. Furthermore, a size of the memory cell itself can be shrunk and the trench 200 which is one unit of storing a data can be located in $4F^2$ in the present invention, unlike the size of conventional device was $8F^2$. Therefore, an integrality of the semiconductor memory device can be increased.

And, the transistor and the capacitor are located in one trench 200, and the gate electrode of the transistor can be located in a depth direction. As a result, the semiconductor memory device integrated highly can overcome a short channel problem.

Also, each of the semiconductor memory devices is formed symmetrically with a center of the bit line contact (As doped poly crystalline silicon layer 20). As a result, unbalance of electrical characteristics, which is caused by the deviation between them, does not occur and good electrical characteristics can be acquired.

Also, the As doped poly crystalline silicon 14 has a first portion formed on the oxide layer 8 and a second portion formed right above the first portion, and the first portion is used as a gate electrode of the memory cell and the second portion is used as a word line. It should be noted that the As doped poly crystalline silicon layer 14 having the first portion and the second portion is formed with self align to the capacitor comprised of the oxide layer 8, the As doped poly crystalline silicon layer 9 and the N type diffusion layers 7.

Also, the As doped poly crystalline silicon layer 14 used as the gate electrode and the word line is covered with the oxide layer 2 and the SiN layer 16 and 17. Therefore, the As doped poly crystalline silicon layer 20 used as a bit line contact can be in contact with the N type diffusion layer 21 used as a drain/source electrode without being shortened between the As doped poly crystalline silicon layer 20 and the As doped poly crystalline silicon layer 14 having the first portion and the second portion.

By using the present invention, it is possible to provide the semiconductor memory device and the manufacturing thereof which has high integrality and good electrical characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A semiconductor memory device having a trench capacitor, comprising:

a semiconductor substrate of a first conductivity type, having a trench which is formed from an upper surface of the semiconductor substrate to a predetermined depth;

a capacitor formed in a lower portion of the trench and the semiconductor substrate of the first conductivity type which is adjacent to the lower portion of the trench;

a first conductive layer formed in the first trench and right above the first capacitor to which the first conductive layer is electrically connected;

a first insulation film formed in the trench and right above the first conductive layer;

a first diffusion layer formed in the semiconductor substrate of the first conductivity type which is adjacent to the first conductive layer and the first insulation film, the first diffusion layer served as a source/drain electrode;

a gate insulation film formed on a predetermined portion of the trench, the predetermined portion being located above the first insulation film;

a second diffusion film formed in an upper portion of the semiconductor substrate of the first conductivity type, the second diffusion layer being adjacent to the gate insulation film and served as a source/drain electrode;

a second conductive layer having a first portion formed on the gate insulation film in the trench and a second portion formed right above the first portion and extended up to a higher position than an upper surface of the semiconductor substrate of the first conductivity type, the first and the second portions served as a gate electrode and a word line respectively; and a second insulation film covered with an upper and side surface of the second portion of the gate electrode.

2. The semiconductor memory device having a trench capacitor according to claim 1, further comprising:

a bit line contact isolated electrically from the gate electrode by the second insulation film and connected electrically to the second diffusion layer; and a bit line connected electrically to the bit line contact.

3. The semiconductor memory device having a trench capacitor according to claim 1, wherein the bit line contact is in contact with the second insulation film that is formed above an upper and a side surfaces of the second portion of the gate electrode.

4. The semiconductor memory device having a trench capacitor according to claim 1, wherein the capacitor is comprised of a plate electrode that is formed in the semiconductor substrate of a first conductivity type, a storage electrode that is formed in the trench and a capacitor dielectric film that is formed between the plate electrode and the storage electrode.

5. The semiconductor memory device having a trench capacitor according to claim 4, further comprising a third insulation film that is formed on the storage electrode in the trench and is contact with the first conductive layer.

6. The semiconductor memory device having a trench capacitor according to claim 1, wherein the first conductive layer has a cross section of T shape.

7. A semiconductor memory device having a trench capacitor, comprising:
 a semiconductor substrate of a first conductivity type, having a first and second trenches which are formed from an upper surface of the semiconductor substrate to a predetermined depth respectively;
 a first capacitor formed in a lower portion of the first trench and the semiconductor substrate of the first conductivity type which is adjacent to the lower portion of the first trench;
 a second capacitor formed in a lower portion of the second trench and the semiconductor substrate of the first conductivity type which is adjacent to the lower portion of the second trench;
 a first conductive layer formed in the first trench and right above the first capacitor to which the first conductive layer is electrically connected;
 a second conductive layer formed in the second trench and right above the second capacitor to which the second conductive layer is electrically connected;
 first and second insulation films formed in the first and second trenches and right above the first and second conductive layer respectively;
 a first diffusion layer formed in the semiconductor substrate of the first conductivity type which is adjacent to the first conductive layer and the first insulation film, the first diffusion layer served as a source/drain electrode;
 a second diffusion layer formed in the semiconductor substrate of the first conductivity type which is adjacent to the second conductive layer and the second insulation film, the second diffusion layer served as a source/drain electrode;
 a first gate insulation film formed on a predetermined portion of the first trench, the predetermined portion being located above the first insulation film;
 a second gate insulation film formed on a predetermined portion of the second trench, the predetermined portion being located above the second insulation film;
 a third diffusion layer formed in an upper portion of the semiconductor substrate of the first conductivity type, the third diffusion layer being adjacent to the first and second gate insulation films, and served as a source/drain electrode;
 a third conductive layer having a first portion formed on the first gate insulation film in the first trench and a second portion formed right above the first portion and extended up to a higher position than an upper surface of the semiconductor substrate of the first conductivity type, the first and the second portions served as a gate electrode and a word line respectively;
 a fourth gate electrode having a third portion formed on the second gate insulation film in the second trench and a fourth portion formed right above the third portion and extended up to a higher position than an upper surface of the semiconductor substrate of the first conductivity type, the third and the fourth portions served as a gate electrode and a word line respectively;
 a fifth insulation film covered with an upper and side surface of the second portion of the third conductive layer; and
 a sixth insulation film covered with an upper and side surface of the fourth portion of the fourth gate electrode.

8. The semiconductor memory device having a trench capacitor according to claim 7, further comprising:
 a bit line contact isolated electrically from the third and fourth conductive layers by the fifth and sixth insulation films and connected electrically to the third diffusion layer; and
 a bit line connected electrically to the bit line contact.

9. The semiconductor memory device having a trench capacitor according to claim 7, wherein the bit line contact is in contact with (a) the fifth insulation film that is formed above an upper surface of the second portion of the third conductive layer, (b) the sixth insulation film that is formed above an upper surface of the fourth portion of the fourth conductive layer and (c) the fifth and sixth insulation films that are formed between the second and the fourth portions.

10. The semiconductor memory device having a trench capacitor according to claim 7, wherein he first capacitor is comprised of a first plate electrode that is formed in the semiconductor substrate of a first conductivity type, a first storage electrode that is formed in the first trench and a first capacitor dielectric film that is formed between the first plate electrode and the first storage electrode, wherein the second capacitor is comprised of a second plate electrode that is formed in the semiconductor substrate of a first conductivity type, a second storage electrode that is formed in the second trench and a second capacitor dielectric film that is formed between the second plate electrode and the second storage electrode.

11. The semiconductor memory device having a trench capacitor according to claim 10, further comprising:
 a seventh insulation film that is formed on the first storage electrode in the first trench and is contact with the first conductive layer; and
 a eighth insulation film that is formed on the second storage electrode in the second trench and is contact with the second conductive layer.

12. The semiconductor memory device having a trench capacitor according to claim 7, wherein each of the first and second conductive layers has a cross section of T shape.

* * * * *